United States Patent
Richter et al.

(10) Patent No.: US 12,200,087 B2
(45) Date of Patent: Jan. 14, 2025

(54) DYNAMIC DATA CONVERSION FOR NETWORK COMPUTER SYSTEMS

(71) Applicant: XILINX, INC., San Jose, CA (US)

(72) Inventors: Edward Richter, Tucson, AZ (US); Paul Hartke, Sunnyvale, CA (US); Philip James-Roxby, Longmont, CO (US)

(73) Assignee: XILINX, INC., San Jose, CA (US)

( * ) Notice: Subject to any disclaimer, the term of this patent is extended or adjusted under 35 U.S.C. 154(b) by 219 days.

(21) Appl. No.: 18/080,602

(22) Filed: Dec. 13, 2022

(65) Prior Publication Data

US 2024/0195889 A1    Jun. 13, 2024

(51) Int. Cl.
| | |
|---|---|
| *H04L 69/08* | (2022.01) |
| *H03M 7/24* | (2006.01) |
| *G06F 3/06* | (2006.01) |
| *G06F 5/00* | (2006.01) |
| *H04L 1/00* | (2006.01) |

(52) U.S. Cl.
CPC ............ *H04L 69/08* (2013.01); *H03M 7/24* (2013.01); *G06F 3/0659* (2013.01); *G06F 5/00* (2013.01); *H04L 1/0011* (2013.01)

(58) Field of Classification Search
CPC ........ H04L 69/08; H04L 1/0011; H03M 7/24; G06F 3/0659; G06F 5/00
See application file for complete search history.

(56) References Cited

U.S. PATENT DOCUMENTS

2022/0365725 A1* 11/2022 Ignatowski ........... G06F 3/0658

OTHER PUBLICATIONS

Rhu, Minsoo, et al. "Compressing DMA Engine: Leveraging Activation Sparsity for Training Deep Neural Networks," 2018 IEEE International Symposium on High Performance Computer Architecture (HPCA), 2018, pp. 78-91.

Nvidia, "Nvidia® Mellanox® Scalable Hierarchical Aggregation and Reduction Protocol (SHARP)," Nvidia Mellanox SHARP v2.1. 4, 2022, 37 pgs. https://docs.nvidia.com/networking/display/sharpv214.

* cited by examiner

*Primary Examiner* — Joseph J Lauture
(74) *Attorney, Agent, or Firm* — Patterson + Sheridan, LLP

(57) ABSTRACT

A computing node for a computing system includes a processor, conversion circuitry, and routing circuitry. The processor generates a data signal based on a function of an application executed by the computing system. The data signal has a first precision format and a first sparse representation. The conversion circuitry receives the data signal from the processor and generate a converted data signal by at least one of converting the first precision format to a second precision format and converting the first sparse representation to a second sparse representation. The routing circuitry transmits the converted data signal to switch circuitry of the computing system.

20 Claims, 5 Drawing Sheets

DYNAMIC DATA CONVERSION FOR NETWORK COMPUTER SYSTEMS

TECHNICAL FIELD

Examples of the present disclosure generally relate to dynamically converting data signals by computing elements of a network computer system based on the supported processing features of the computing elements.

BACKGROUND

Collective computing systems include interconnected computing nodes and switch circuitries. Two or more computing nodes are connected to a common switch circuitry that obtains and combines the data from the computing nodes to execute an application. In some instances, the switch circuitry and computing nodes include network infrastructure hardware such as network switches and network interface controllers (NICs) to increase the network throughput of the corresponding collective computing system. Further, the computing nodes include support to process sparse data and low-precision data types. As a collective computing system includes multiple computing nodes and/or switch circuitries, a sparse representation and precision format supported by all computing nodes and switch circuitries is used to ensure any data signals communicated within a collective computing system are compatible with each of the computing nodes and switch circuitries. However, using a static sparse representation and/or precision format limits the types of computing nodes and/or switch circuitries that may be used, and limits the bandwidth of the corresponding network infrastructure.

SUMMARY

In one example, a computing node includes a processor, conversion circuitry, and routing circuitry. The processor generates a data signal based on a function of an application. The data signal has a first precision format and a first sparse representation. The conversion circuitry receives the data signal from the processor and generate a converted data signal by at least one of converting the first precision format to a second precision format and converting the first sparse representation to a second sparse representation. The routing circuitry transmits the converted data signal to switch circuitry.

In one example, a computing system includes switch circuitry and a first computing node. The first computing node includes a processor, conversion circuitry, and routing circuitry. The processor generates a data signal based on a function of an application. The data signal has a first precision format and a first sparse representation. The conversion circuitry receives the data signal from the processor, and generates a converted data signal by at least one of convert the first precision format to a second precision format and convert the first sparse representation to a second sparse representation. The routing circuitry transmits the converted data signal to the switch circuitry.

In one example, a method includes generating, by a processor of a computing node, a data signal based on a function of an application. The data signal has a first precision format and a first sparse representation. The method further includes converting, by conversion circuitry of the computing node, the data signal to at least one of a second precision format from the first precision format and a second sparse representation from the first sparse representation to generate a converted data signal. Further, the method includes transmitting the converted data signal to switch circuitry.

BRIEF DESCRIPTION OF DRAWINGS

So that the manner in which the above recited features can be understood in detail, amore particular description, briefly summarized above, may be had by reference to example implementations, some of which are illustrated in the appended drawings. It is to be noted, however, that the appended drawings illustrate only typical example implementations and are therefore not to be considered limiting of its scope.

DETAILED DESCRIPTION

Figure 1:
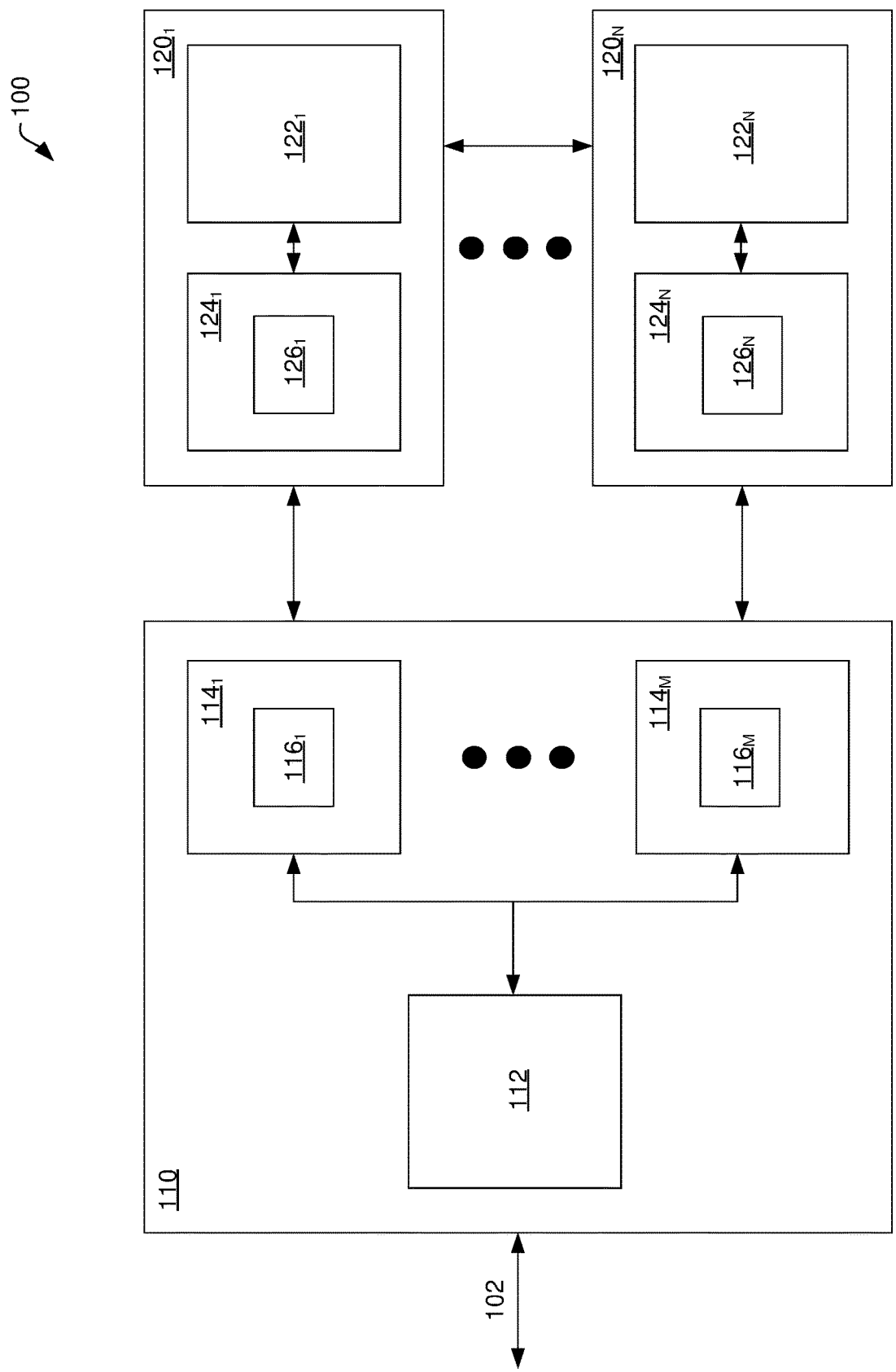
FIG. 1 is a block diagram of a computing system.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the features or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

A collective computing system (e.g., a distributed computing system) includes multiple computing nodes (e.g., compute enabled endpoints) interconnected via switch circuitries. The computing nodes perform various functions of an application, and provide data signals to a switch circuitry. The switch circuitry combines (e.g., reduces) the data signals from the different computing nodes into a common data signal and outputs the common data signal for further processing. In one or more examples, an application executed by a collective computing system is a machine learning (ML) application. For example, a collective computing system may be used to train a neural network. In other examples, a collective computing system performs other types of applications.

The computing nodes and switch circuitries include network interface hardware elements (e.g., network switches and network interface controllers (NICs)). Each of the computing nodes performs a function of the application. When performing the function of the application, the computing nodes generate data with a corresponding sparse representation and format. The sparse representation corresponds to the number of non-zero elements within the data (e.g., the number of zero-valued elements divided by the total number of elements within the data). In one or more examples, the sparse representation corresponds to location information of the non-zero elements and/or zero elements within the data. In one or more examples, the sparse representation corresponds to the number of non-zero elements and the location information of the non-zero elements and/or zero elements within the data. Further, the format of the data corresponds to a precision format used to represent the data. For example, the precision format may be a single precision floating-point format, a double precision floating-point format, a multi-precision format, and/or a mixed precision format, among others. In one or more examples, the format of the data includes X number of bits, where X is one or more. Further, in one or more examples, the different data formats correspond to different precision levels.

As is described in more detail by the disclosure herein, the switch circuitry and/or computing nodes of a collective computing system are able to convert a sparse representation of the data and/or a format (e.g., precision format) of the data to another sparse representation and/or another format. For example, a computing node is able to process data using a first sparse representation and/or a first format, and transmit the data using a second sparse representation and/or a second format. In such an example, a computing node processes data using a natively supported sparse representation and/or format, and converts the data to a sparse representation and/or format supported by the corresponding switch circuitry. Further, in one or more examples, a computing node is able to receive data in an unsupported sparse representation and/or format, convert the data to a supported sparse representation and/or format, and process the converted data. In other examples, switch circuitry is able to process data using a first sparse representation and/or first format, and transmit the data using a second sparse representation and/or second format. In such an example, the switch circuitry processes data using a natively supported sparse representation and/or format, and converts the data to a sparse representation and/or format supported by the corresponding computing node. Further, in one or more examples, switch circuitry is able to receive data in an unsupported sparse representation and/or format, convert the data to a supported sparse representation and/or format, and process the converted data.

Dynamically converting the sparse representation and/or format of the data allows a computing node to utilize sparse representations and/or formats not supported by other computing nodes and/or the switch circuitry, and/or the switch circuitry to utilize sparse representations and/or formats not supported by the computing nodes. Accordingly, the different types of computing nodes and switch circuitries that may be used to form a collective computing system is increased, providing more design flexibility. Further, as the workloads of the computing nodes change when executing the functions of an application, the sparse representation and/or data format can be changed, dynamically adjusting the sparse representation of the data and/or precision of the data.

As is described herein, the computing nodes and/or switch circuitry of a collective computing system include conversion circuitry that is able to dynamically convert the sparse representation and/or format of a data signal. The conversion is based on a sparse presentation and/or format supported by the corresponding computing node or switch circuitry, statistical information corresponding to the executed application, and/or a set number of processes or transmissions, among others. A collective computing system that incorporates dynamic conversion of data provides a higher network throughput and increased design flexibility as compared to collective computing systems that do not incorporate dynamic conversion of data. In one or more examples, network throughput may be increased while maintaining the accuracy of the application executed by the corresponding computing system. Further, the network throughput is increased by compressing data sent between the elements of the computing system using a compressed representation of the sparse data and a low precision data format.

FIG. 1 illustrates a computing system 100. In one or more examples, the computing system 100 is a collective computing system or a distributed computing system. The computing system 100 may be one of a plurality of computing systems interconnected to form a larger computing system (e.g., a data center or another type of multiple computer processing system). In such an example, the computing system 100 is one node of a plurality of nodes within the larger collective computing system. In one or more examples, the computing system 100 corresponds to a node at a first hierarchy level within the larger collective computing system, and is connected via interconnect 102 to a higher hierarchy level (e.g., a node at a higher hierarchy level). In one example, the computing system 100 is connected to switch circuitry of another node. Such a node may be connected to, and receive data from a switch circuitry or another node via the interconnect 102.

The computing system 100 includes switch circuitry 110 and computing nodes 120 (e.g., compute endpoints). The switch circuitry 110 is connected to each of the computing nodes 120. The computing nodes 120 include computing node $120_1$-computing node $120_N$. N is two or more. In other examples, N is at least 10, 100, or more.

The switch circuitry 110 includes processor 112 and line card circuitries $114_1$-$114_M$. M is two or more. In one example, the number of line card circuitries 114 is at least the number of computing nodes 120. The processor 112 may represent one or more processors, such as a microprocessor, a central processing unit, or the like. In one or more examples, the processor 112 is complex instruction set computing (CISC) microprocessor, reduced instruction set computing (RISC) microprocessor, very long instruction word (VLIW) microprocessor, or a processor implementing other instruction sets, or a processor implementing a combination of instruction sets. The processor 112 may be one or more special-purpose processing devices such as an application specific integrated circuit (ASIC), a field programmable gate array (FPGA), a digital signal processor (DSP), network processor, or the like.

The processor 112 is coupled (e.g., communicatively coupled) with each of the line card circuitries 114. The processor 112 receives data from and transmits data to the line card circuitries 114. The line card circuitries 114 are coupled (e.g., communicatively coupled) with the computing nodes 120. In one example, each line card circuitry 114 is coupled to a respective one of the computing nodes 120, and transmits and receives data from the respective one of the computing nodes 120.

The line card circuitries 114 may include conversion circuitry 116. For example, the line card circuitry $114_1$ includes conversion circuitry $116_1$ and the line card circuitry $114_M$ includes conversion circuitry $116_M$. In other examples, the conversion circuitry 116 within one or more of the line card circuitries 114 is omitted. The conversion circuitry 116 converts a sparse representation and/or format of a data signal received by and/or transmitted by the switch circuitry 110. The conversion circuitry 116 is described in greater detail with regard to FIG. 3.

Each of the computing nodes 120 includes a processor 122 and network interface controller (NIC) circuitry 124. For example, the computing node $120_1$ includes a processor $122_1$ and NIC circuitry $124_1$, and the computing node $120_N$ includes a processor $122_N$ and NIC circuitry $124_N$. The processors 122 are configured similar to the processor 112. Each of the processors 122 may be configured similarly, or one or more of the processors 122 is configured differently than another one of the processors 122.

The computing nodes 120 perform one or more processes of an application executed by the computing system 100. The application may correspond to training a neural network, or data processing, among others. The computing nodes 120 function as a group to perform the collective functions of the application. Each of the computing nodes 120 generates interim results that are collected and combined by the switch circuitry 110.

Each of the processors 122 is coupled (e.g., communicatively coupled) with a respective NIC circuitry 124. For example, the processor $122_1$ is coupled with the NIC circuitry $124_1$, and transmits data to and receives data from the NIC circuitry $124_1$. Further, the processor $122_N$ is coupled with the NIC circuitry $124_N$, and transmits data to and receives data from the NIC circuitry $124_N$.

The NIC circuitries 124 may include conversion circuitry 126. For example, the NIC circuitry $124_1$ includes conversion circuitry $126_1$ and the NIC circuitry $124_N$ includes conversion circuitry $126_N$. In other examples, the conversion circuitry 126 within one or more of the NIC circuitries 124 is omitted. The conversion circuitry 126 converts the sparse representation and/or format of a data signal transmitted by and/or received by the corresponding computing node 120. The conversion circuitry 126 is described in greater detail with regard to FIG. 2.

In one or more examples, the switch circuitry 110 communicates collective routines to each of the computing nodes 120. The collective routines are processes executed by each of the computing nodes 120. In one example, the collective routines includes a broadcast function, an "AllReduce" function, and an "AllGather" function, among others. A broadcast function distributes data from the switch circuitry 110 to the computing nodes 120 and/or between computing nodes 120. The broadcast function may be used to synchronize the computing nodes 120 with each other and/or with the switch circuitry 110. The "AllReduce" function combines data collected from the computing nodes 120 generating a common global result (e.g., combined data). The "AllGather" function collects data from the computing nodes 120 and stores the collected data within the switch circuitry 110. The switch circuitry 110 broadcasts the collected data to each of the computing nodes 120.

In one or more example, the data communicated between the switch circuitry 110 and the computing nodes 120 may be a tensor (e.g., a multi-dimensional matrix). A tensor data format includes elements that may be in a dense tensor or a sparse tensor. A sparse tensor may be used to reduce the amount of memory used to store the corresponding data of the tensor. In one example, a list is used to store the non-zero values of a tensor and a list of the corresponding indices. A dictionary of keys may be used to map the indices to non-zero elements with the tensor.

As is described above, the computing system 100 performs (e.g., executes) a collective processing function. The computing nodes 120 perform a one or more processing functions of the collective processing function. Each of the computing nodes 120 generates an interim (or node-level) result and communicates the interim result to the switch circuitry 110. The switch circuitry 110 combines the interim results into a single result. The switch circuitry 110 may communicate the combined single result to another node via the interconnect 102.

The computing nodes 120 generate a data signal based on the corresponding application being executed. In such an example, the switch circuitry 110 acquires (e.g., obtains or receives) the data signal (e.g., tensors) from the computing nodes 120 by invoking one or more "AllGather" function. The "AllGather" function may be used to acquire the data values and indices of the sparse tensor from each of the computing nodes 120. The acquired data may be combined (e.g., reduced) via n "AllReduce" function by the switch circuitry 110 and broadcast to the computing nodes 120 to synchronize the computing nodes 120.

In one or more examples, not all of the computing nodes 120 support all of the same sparse representations and/or precision data types. Further, the switch circuitry 110 may not support all of the same sparse representations and/or formats (e.g., precision data types) as the computing nodes 120. Accordingly, one or more of the conversion circuitries 116 and 126 may be used to convert the sparse representation and/or the format of the transmitted data. For example, the computing node $120_1$ may support a sparse representation not supported by the switch circuitry 110. In such an example, the conversion circuitry $126_1$ converts the data signal generated by the processor $122_1$ from a first sparse representation to a sparse representation supported by the switch circuitry 110. In another example, the data signal is transmitted from the computing node 120 without being converted (e.g., the conversion circuitry $126_1$ may be omitted or bypassed), and the conversion circuitry $116_1$ converts the data signal to a sparse representation supported by the processor 112. Two or more of the computing nodes 120 may support different sparse representations. In such an example, the respective conversion circuitry 126 or the conversion circuitry 116 converts the data signal to a sparse representation supported by the processor 112.

Figure 2:
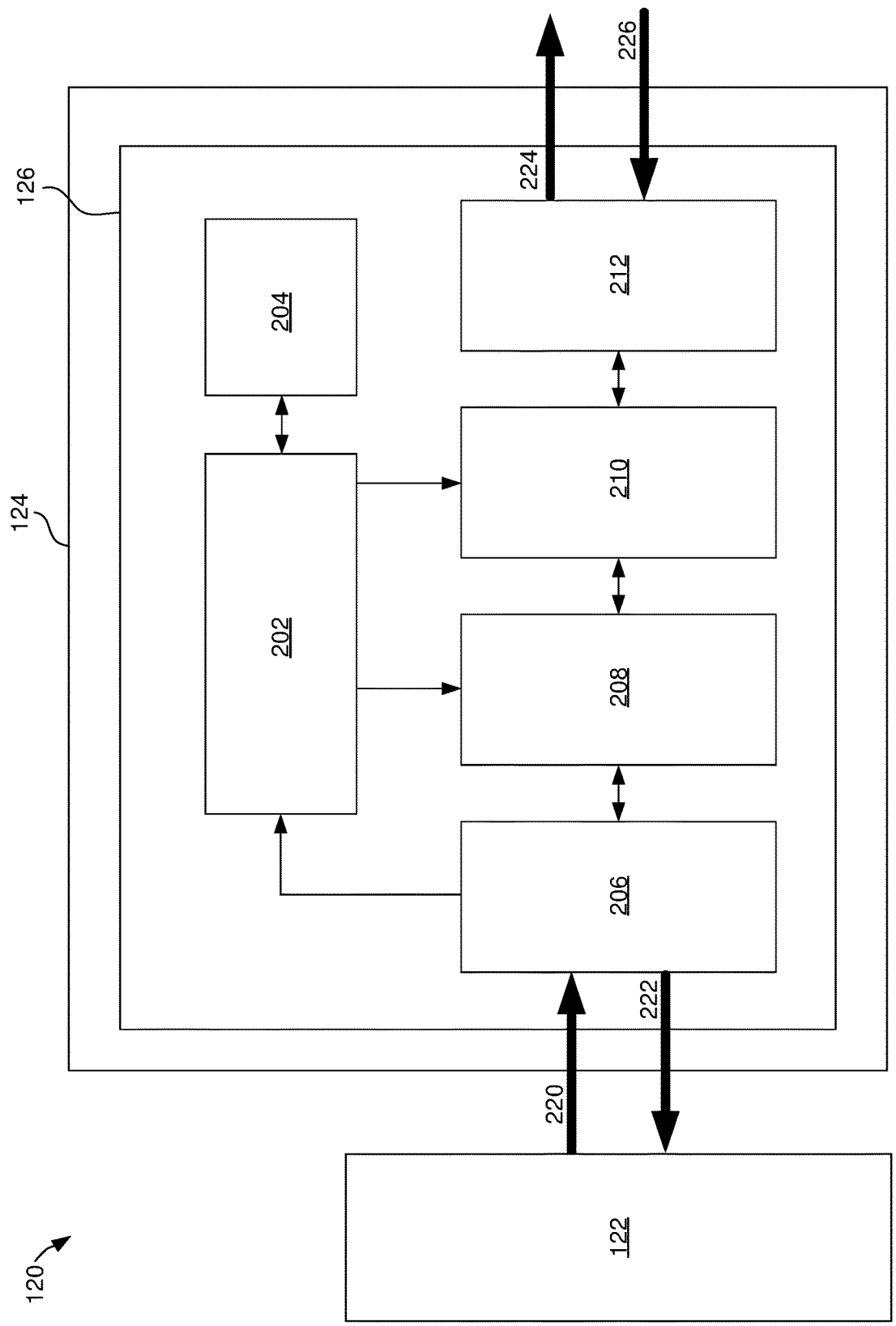
FIG. 2 is a block diagram of conversion circuitry of a computing node of a computing system.

FIG. 2 illustrates an example block diagram of the computing node 120. The computing node 120 includes the processor 122, the NIC circuitry 124, and the conversion circuitry 126. The conversion circuitry 126 includes a controller 202, memory 204, buffer 206, format converter circuitry 208, sparsity converter circuitry 210, and routing circuitry 212.

The buffer 206 is a memory element that receives data (e.g., a tensor) from the processor 122. Further, the buffer 206 may provide data to the processor 122. The buffer 206 is connected to the controller 202 and the format converter circuitry 208. In one example, the buffer 206 provides statistical information to the controller 202. The statistical information may correspond to the application being executed. Further, the statistical information may correspond to Max_exponent, Min_exponent, value range, number of zeros, number of de-normalized values, total tensor size, and a dynamic range of the values, among others. The statistical information may be determined by the processor 122.

The controller 202 may be configured similar to the processor 122. In one example, the controller 202 is communicatively coupled with the format converter circuitry 208 and the sparsity converter circuitry 210. The controller 202 instructs the format converter circuitry 208 to convert the format of the data signal 220 or not to convert the format of the data signal 220. For example, the controller 202 instructs the format converter circuitry 208 to convert the data signal 220 from a first format to a second format. The formats corresponds to a data precision. The first format may correspond to a level of precision different from the second format (e.g., a higher or lower precision). In one example, the formats corresponds to a floating-point number format, among others.

In one example, the controller 202 determines to convert, or not to convert, the format of the data signal 220 based on the statistical information. For example, the controller 202 may determine to increase or decrease the floating-point number format of the data signal 220 based on changes to the statistics of the application executed by the computing system 100. In other example, process information (e.g., a number of data signal transmissions and/or receipts) may be used to determine to convert a data signal or not convert the data signal. In one example based on a number of data signal transmissions and/or receipts exceeding a corresponding threshold or thresholds, the sparse representation and/or data format is converted.

In one example, the controller 202 receives the data signal 220 from the buffer 206 and determines to convert, or not to convert, the format of the data based on information stored within the memory 204. For example, the memory 204 may include an indication with regard to the format supported by the corresponding switch circuitry (e.g., the switch circuitry 110 of FIG. 1) and/or another computing node. The controller 202 accesses the supported format information within the memory 204, selects a supported format for the switch circuitry 110, and instructs the format converter circuitry 208 to convert the data signal 220 and to the supported format. In another example, the controller 202 determines that the data signal 220 is in a format supported by the switch circuitry 110 and instructs the format converter circuitry 208 not to convert the format of the data signal 220.

In one example, the controller 202 determines whether to convert the sparse representation of the data signal 220 or not to convert he sparse representation of the data signal 220 based on information stored within the memory 204. For example, the memory 204 may include an indication with regard to the sparse representation supported by the corresponding switch circuitry (e.g., the switch circuitry 110 of FIG. 1) and/or another computing node. The controller 202 accesses the supported sparse representation information within the memory 204, selects a supported sparse representation for the switch circuitry 110, and instructs the sparsity converter circuitry 210 to convert the data signal 220 to a supported sparse representation. In another example, the controller 202 determines that the data signal 220 is in a sparse representation supported by the switch circuitry 110 and instructs the sparsity converter circuitry 210 not to convert the sparse representation of the data signal 220.

The routing circuitry 212 receives the data signal from the sparsity converter circuitry 210. The data received by the routing circuitry 212 is the data signal 220 having a converted format and/or sparse representation. In one example, the data provided to the routing circuitry 212 is the data signal 220 without the corresponding format and/or sparse representation being converted. The routing circuitry 212 communicates the data signal to the switch circuitry 110 as the data signal 224.

The routing circuitry 212 receives the data signal 226 from the switch circuitry 110. The routing circuitry 212 provides the data signal 226 to the sparsity converter circuitry 210. In one example, the data signal 226 is also provided to the controller 202. In one example, the controller 202 determines to convert or not to convert the sparse representation of the data signal 226 based on information stored within the memory 204. For example, the memory 204 includes an indication with regard to the sparse representation supported by the processor 122. The controller 202 accesses the supported sparse representation information within the memory 204, selects a supported sparse representation for the processor 122, and instructs the sparsity converter circuitry 210 to convert the data signal 226 to the supported sparse representation. In another example, the controller 202 determines that the data signal 226 is in a sparse representation supported by the processor 122 and instructs the sparsity converter circuitry 210 not to convert the sparse representation of the data signal 226.

In one example, the controller 202 determines to or not to convert the format of the data signal 226 based on information stored within the memory 204. For example, the memory 204 includes an indication with regard to the format supported by the processor 122. The controller 202 accesses the supported format information within the memory 204, selects a supported format for the processor 122, and instructs the format converter circuitry 208 to convert the data signal 226 to a supported format. In another example, the controller 202 determines that the data signal 226 is in a format supported by the processor 122 and instructs the format converter circuitry 208 not to convert the format of the data signal 226.

The format converter circuitry 208 outputs the data signal 222 to the processor 122. The data signal 222 is the data signal 226 that is format converted and/or sparse representation converted. In other examples, the data signal 222 is the data signal 226 that has not been converted.

While FIG. 2 illustrates the controller 202, the memory 204, the buffer 206, the format converter circuitry 208, the sparsity converter circuitry 210, and the router circuitry 212 as being external to the processor 122, in other examples, one or more of the controller 202, the memory 204, the buffer 206, the format converter circuitry 208, the sparsity converter circuitry 210, and the routing circuitry 212 is included within the processor 122.

Figure 3:
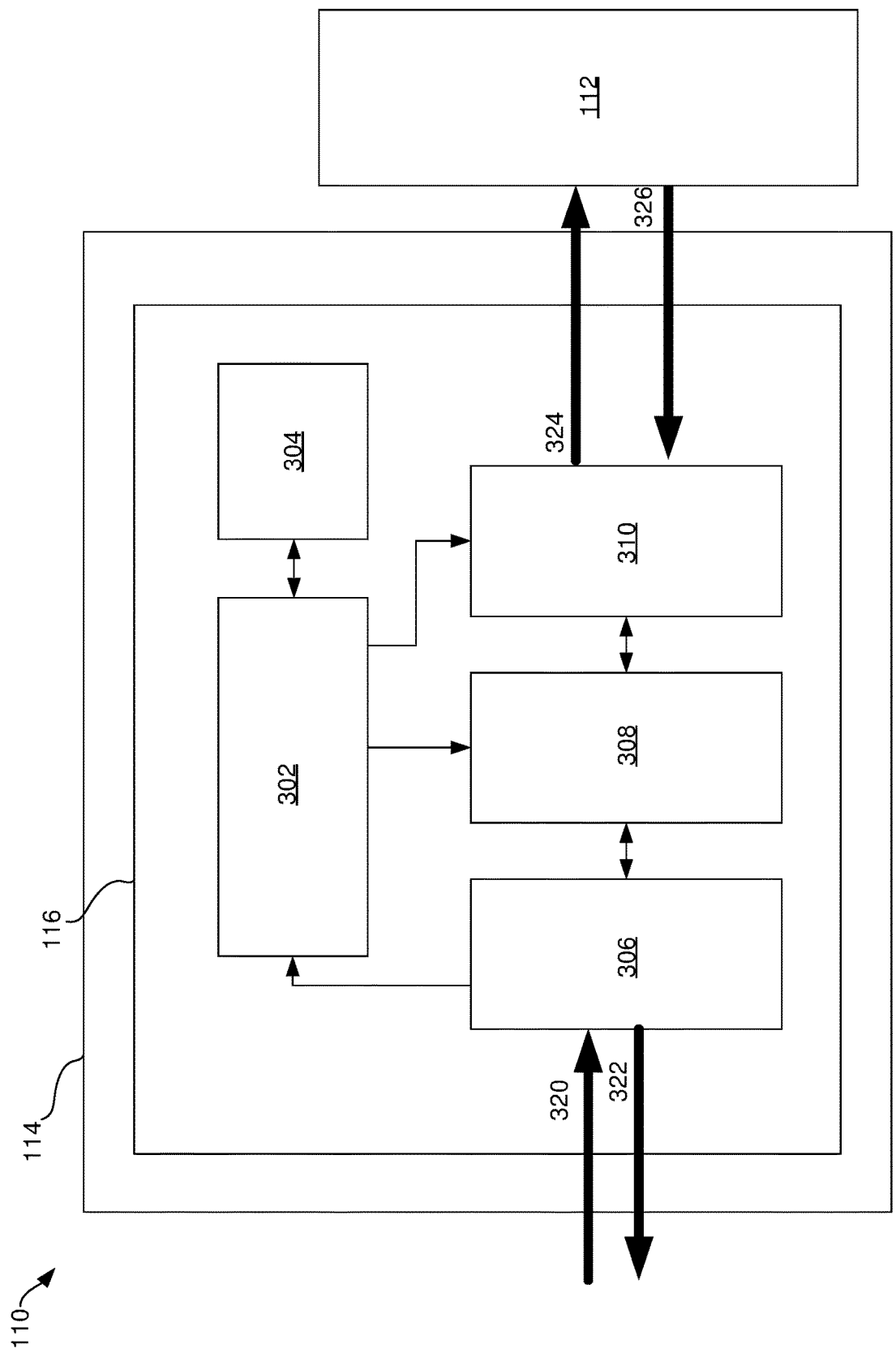
FIG. 3 is a block diagram of conversion circuitry of switch circuitry of a computing system.

FIG. 3 illustrates an example block diagram of the switch circuitry 110. The switch circuitry 110 includes the processor 112, the line card circuitry 114, and the conversion circuitry 116. The conversion circuitry 116 includes a controller 302, a memory 304, a buffer 306, format converter circuitry 308, and sparsity converter circuitry 310.

The buffer 306 is a memory element that receives a data signal (e.g., a tensor) from and transmits data to the computing nodes 120. Further, the buffer 306 may provide the data signal to the processor 112. The buffer 306 is connected to the controller 302 and the format converter circuitry 308. In one example, the buffer 306 provides statistical information to the controller 302.

The controller 302 may be configured similar to the processor 112. In one example, the controller 302 is communicatively coupled with the format converter circuitry 308 and the sparsity converter circuitry 310. The controller 302 instructs the format converter circuitry 308 to convert the format of the data signal received from the buffer 306 or not to convert the format of the data signal received from the buffer 306. For example, the controller 302 instructs the format converter circuitry 308 to convert the data signal from a first format to a second format. In one or more examples, the controller 302 instructs the format converter circuitry 308 to convert the format of the data received from the sparsity converter circuitry 310 or not to convert the format of the data signal received from the sparsity converter circuitry 310.

In one example, the controller 302 receives the data signal 320 from the buffer 306 and determines to convert, or not to convert, the format of the data signal 320 based on the statistical information.

In one example, the controller 302 receives the data signal 320 from the buffer 306 and determines to convert, or not to convert, the format of the data signal 320 based on information stored within the memory 304. For example, the memory 304 may include the format or formats supported by the processor 112. The controller 302 accesses the supported format information within the memory 304, selects a format supported by the processor 112, and instructs the format converter circuitry 308 to convert the data signal 320 to the supported format. In another example, the controller 302 determines that the data signal 320 is in a format supported by the processor 112 and instructs the format converter circuitry 308 not to convert the format of the data signal 320.

In one example, the controller 302 determines to convert, or not to convert, the sparse representation of the data signal 320 based on information stored within the memory 304. For example, the memory 304 includes the sparse representation or representations supported by the processor 112. The controller 302 accesses the supported sparse representation information within the memory 304, selects a supported sparse representation supported by the processor 112, and instructs the sparsity converter circuitry 310 to convert the data signal 320 to the supported sparse representation. In another example, the controller 302 determines that the data signal 320 is in a sparse representation supported by the processor 122 and instructs the sparsity converter circuitry 310 not to convert the sparse representation of the data signal 320. In other example, process information (e.g., a number of data signal transmissions and/or receipts) may be used to determine to or not to convert a data signal by the controller 302. In one example based on a number of data signal transmissions and/or receipts exceeding a corresponding threshold or thresholds, the sparse representation and/or data format is converted.

The sparsity converter circuitry 310 outputs the converted data signal as the data signal 324 to the processor 112. The data signal 324 is a format and/or sparse representation converted version of the data signal 320. In another example, the data signal 324 is the data signal 320 with no conversions applied.

The sparsity converter circuitry 310 receives the data signal 326 from the processor 112. In one example, the data signal 326 is also provided to the controller 302. The controller 302 determines to or not to convert the sparse representation of the data signal 326 based on information stored within the memory 304. For example, the memory 304 includes the sparse representation or representations supported by one or more of the computing nodes 120. The controller 302 accesses the supported sparse representation information within the memory 304, selects a supported sparse representation for the one or more of the computing nodes 120, and instructs the sparsity converter circuitry 310 to convert the data signal 326 and to which sparse representation to convert the data signal 326. In another example, the controller 302 determines that the data signal 326 is in a sparse representation supported by the one or more of the computing nodes 120 and instructs the sparsity converter circuitry 310 not to convert the sparse representation of the data signal 326. In one example, the controller 302 determines that the computing node $120_1$ supports a first sparse representation and the computing node $120_N$ supports a second sparse representation. In such an example, the controller 302 instructs the sparsity converter circuitry 310 to convert the data signal 326 into a first data signal having the first sparse representation and into second data having a second sparse representation.

In one example, the controller 302 determines to convert, or not to convert, the format of the data signal 326 based on information stored within the memory 304. For example, the memory 304 includes the format or formats supported by one or more of the computing nodes 120. The controller 302 accesses the supported format information within the memory 304, selects a supported format for one or more computer nodes 120, and instructs the format converter circuitry 308 to convert the data signal 326 received from the sparsity converter circuitry 310 and to which format to convert the data. In another example, the controller 302 determines that the data signal 326 is in a format supported by one or more computer nodes 120 and instructs the format converter circuitry 308 not to convert the format of the data signal 326. In one example, the controller 302 determines that the computing node $120_1$ supports a first format and the computing node $120_N$ supports a second format. In such an example, the controller 302 instructs the format converter circuitry 308 to convert the data signal 326 into first data signal having a first format and into second data signal having a second format as the data signal 322.

The format converter circuitry 308 outputs the data signal 322 to the buffer 306. The data signal 322 is the data signal 326 that is format converted and/or sparse representation converted. In other examples, the data signal 322 is the data signal 326 that has not been converted.

While FIG. 3 illustrates the controller 302, the memory 304, the buffer 306, the format converter circuitry 308, and the sparsity converter circuitry 210 as being external to the processor 112, in other examples, one or more of the controller 302, the memory 304, the buffer 306, the format converter circuitry 308, and the sparsity converter circuitry 310 is included within the processor 112.

In one example, the switch circuitry 110 determines the formats and/or sparse representations supported by one or more of the computing nodes 120. The computing nodes 120 may broadcast the supported formats and/or sparse representations to the switch circuitry 110 and/or the switch circuitry 110 may request the supported formats and/or sparse representations from the computing nodes 120. The switch circuitry 110 stores the supported formats and/or sparse representations within the memory 304 along with an associated computing node. In another example, one or more of the computing nodes 120 requests the supported formats and/or sparse representations from the switch circuitry 110, and/or the switch circuitry 110 communicates the supported formats and/or sparse representations to the computing nodes 120. The computing nodes 120 store the supported formats and/or sparse representations within the memory 204 with an association with the switch circuitry 110. In one example, the switch circuitry 110 communicates a supported format and/or sparse representation for the computing node $120_1$ to the computing node $120_N$. Further, the computing node $120_1$ may communicate a supported format and/or sparse representation for the switch circuitry 110 to the computing node $120_N$.

Figure 4:
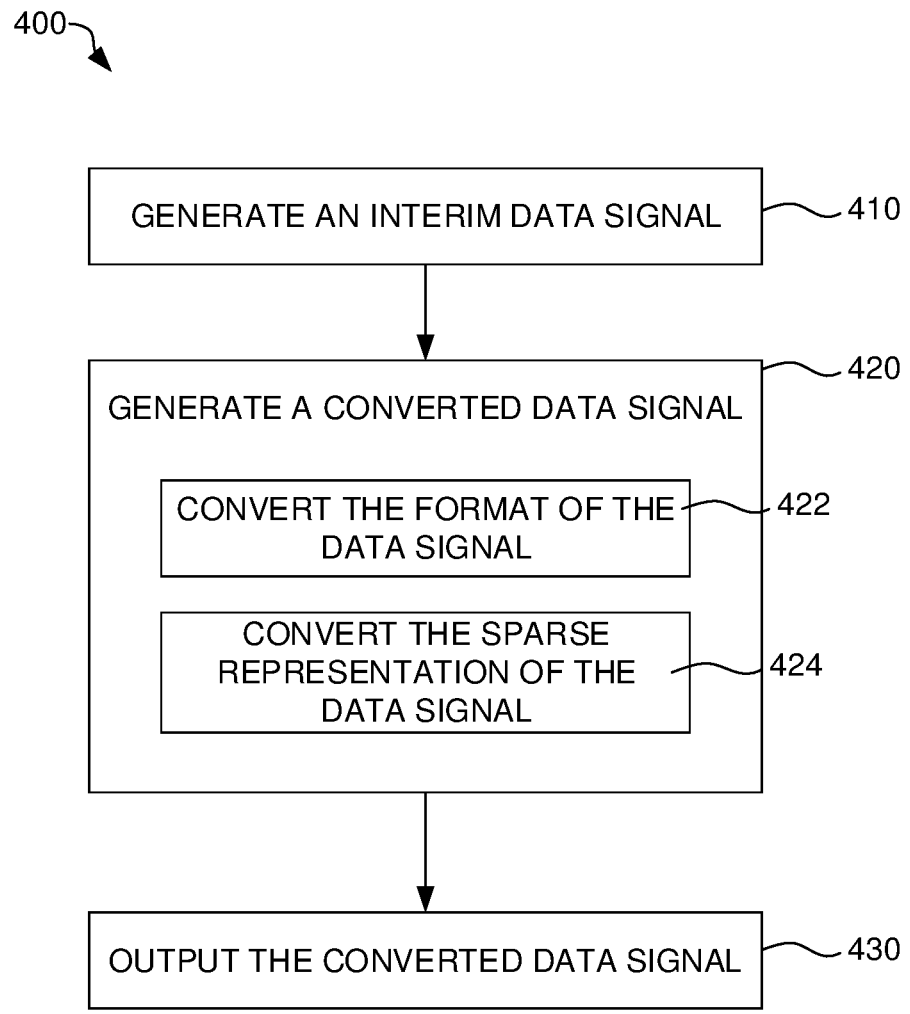
FIG. 4 illustrates a flowchart of a method for converting a data signal within a computing node of a computing system.

FIG. 4 illustrates flowchart of a method 400 for generating a converted data signal within a computing node (e.g., the computing node $120_1$ of FIG. 1). The method 400 may be performed by the computing node $120_1$ of FIG. 1. At 410 of the method 400, an interim data signal is generated. For example, with reference to FIG. 1, the computing node $120_1$ generates an interim data signal. The interim data signal includes interim results generated by the processor $122_1$ of the computing node $120_1$. With reference to FIG. 2, the interim data signal is the data signal 220.

At 420 of the method 400, a converted data signal is generated from the interim data signal. For example, with reference to FIG. 2, the buffer 206 receives the data signal 220 and forwards the data signal 220 to the controller 202 and the format converter circuitry 208. In one example, the buffer 206 receives statistical information from the processor 122 and forwards the statistical information to the controller 202.

At 422 of the method 400, generating a converted data signal includes converting the format of the data signal. The controller 202 receives the data signal 220 from the buffer 206 and determines to convert the format of the data based on information stored within the memory 204, the statistical information, and/or other process information (e.g., a number of transmissions performed). In one example, the controller 202 determines that the format of the data signal 220 is not supported by the switch circuitry 110, and selects a supported format from the memory 204. In one example, the controller 202 determines which format or formats are supported by the switch circuitry 110 based on the format information stored within the memory 204. In another example, the controller 202 determines to increase or decrease a precision of the data signal 220 based on the statistical information. The controller 202 generates instructions to instruct the format converter circuitry 208 to convert data signal 220 from a first format to a second format. The format converter circuitry 208 generates a converted data signal based on the format in the instructions provided by the controller 202. For example, the format converter circuitry 208 converts the format of the data signal 220 from a floating-point format to a second floating-point format based on the instructions provided by the controller 202.

At 424 of the method 400, generating a converted data signal includes converting the sparse representation of the data signal. The controller 202 determines to convert the sparse representation of the data signal 220 based on information stored within the memory 204, the statistical information, and/or other process information (e.g., a number of transmissions performed). The controller 202 determines that the sparse representation of the data signal 220 is not supported by the switch circuitry 110, and selects a supported sparse representation from the memory 204. In another example, the controller 202 determines to adjust the sparse representation based on the statistical information of the corresponding application. In one example, the controller 202 determines which sparse representation or sparse representations are supported by the switch circuitry 110 based on the sparse representation information stored within the memory 204. The controller 202 generates instructions to instruct the sparsity converter circuitry 210 to convert data signal 220 from a first sparse representation to a sparse representation format. The sparsity converter circuitry 210 generates a converted data signal based on the sparse representation in the instructions provided by the controller 202. For example, the sparsity converter circuitry 210 converts the sparse representation of the data signal 220 from a first sparse representation to a second sparse representation based on the instructions provided by the controller 202.

In one example, generating a converted data signal includes performing both 422 and 424 of the method 400. 422 and 424 of the method 400 may be performed in any order. In another example, generating a converted data signal includes performing one of 422 and 424 of the method 400. In such an example, one of 422 and 424 of the method 400 are omitted.

At 430 of the method 400, the converted data signal is output. For example, the converted data signal is output by the routing circuitry 212 to the switch circuitry 110.

In one example, while the method 400 is described above with regard the computing node $120_1$, in other examples, the method 400 may be performed by the switch circuitry 110 to convert a data signal to be output to a format supported by the computing node $120_1$. In such an example, at 420 of the method 400, the conversion circuitry 116 converts one or more of format and sparse representation of a data signal to that supported by the computing node $120_1$ and transmits the converted data signal the computing node $120_1$ at 430 of the method 400. In one or more examples, two or more the computing nodes 120 respectively perform the method 400 during an at least partially overlapping period.

Figure 5:
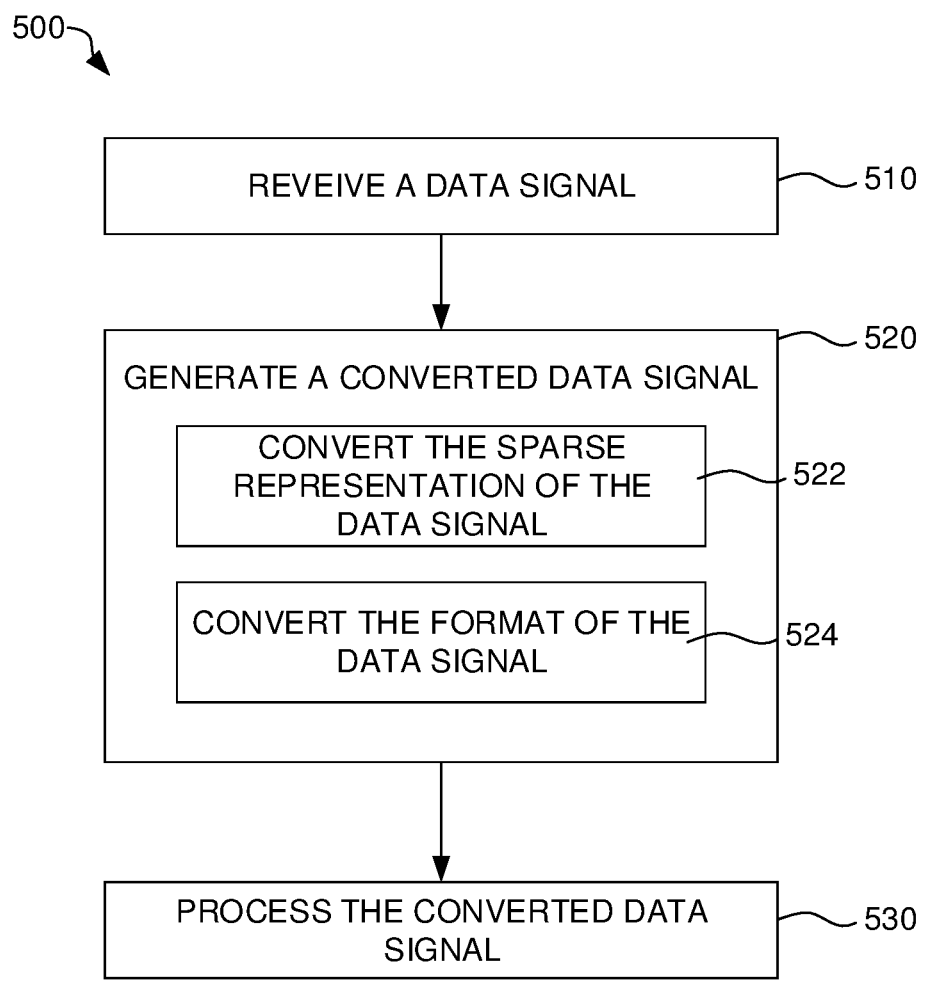
FIG. 5 illustrates a flowchart of a method for converting a data signal received by a computing node of a computing system.

FIG. 5 illustrates flowchart of a method 500 for generating converted a data signal within a computing node (e.g., the computing node $120_1$ of FIG. 1) from a data signal received from switch circuitry (e.g., the switch circuitry 110 of FIG. 1). The method 500 may be performed by the computing node $120_1$ of FIG. 1. At 510 of the method 500, a data signal is received. For example, with reference to FIG. 1, the computing node $120_1$ receives a data signal from the switch circuitry 110. With reference to FIG. 2, the routing circuitry 212 receives the data signal 224.

At 520 of the method 500, a converted data signal is generated from the received data signal. With reference to FIG. 1 and FIG. 2, the computing node $120_1$ converts one or more of a sparse representation and a format of the data signal 224. In one example, the computing node $120_1$ converts the sparse representation of the data signal 224 to a sparse representation supported by the computing node $120_1$. In one or more examples, the computing node $120_1$ converts the format of the data signal 224 to a format supported by the processor $122_1$ of the computing node $120_1$.

At 522 of the method 500, generating a converted data signal includes converting the sparse representation of the data signal. The controller 202 determines to convert the sparse representation of the data signal 224 based on information stored within the memory 204. The controller 202 determines that the sparse representation of the data signal 224 is not supported by the processor $122_1$, and selects a supported sparse representation from the memory 204. In one example, the controller 202 determines which sparse representation or sparse representations are supported by the processor $122_1$ based on the sparse representation information stored within the memory 204. The controller 202 generates instructions to instruct the sparsity converter circuitry 210 to convert data signal 220 from a first sparse representation to a second sparse representation. In one example, the controller 202 selects a sparse representation from the sparse representations supported by the processor $122_1$ as indicated by the memory 204. The sparsity converter circuitry 210 generates a converted data signal based on the sparse representation in the instructions provided by the controller 202. For example, the sparsity converter circuitry 210 converts the sparse representation of the data signal 224 from a first sparse representation to a second sparse representation based on the instructions provided by the controller 202. The first sparse representation has a larger or smaller sparsity amount than the second sparse representation.

At 524 of the method 500, generating a converted data signal includes converting the format of the data signal. The controller 202 receives the data signal 224 and determines to convert the format of the data signal 224 based on information stored within the memory 204. For example, the controller 202 determines that the format of the data signal 224 is not supported by the processor 122₁, and selects a supported format from the memory 204. In one example, the controller 202 determines which format or formats are supported by the processor 122₁ based on the format information stored within the memory 204. The controller 202 generates instructions to instruct the format converter circuitry 208 to convert data signal 224 from a first format to a second format. In one example, the controller 202 selects a format from the formats supported by the processor 122₁ as indicated by the memory 204. The format converter circuitry 208 generates a converted data signal based on format in the instructions provided by the controller 202. For example, the format converter circuitry 208 converts the format of the data signal 224 from a first format to a second format based on the instructions provided by the controller 202. In one example, the first format corresponds to a first floating-point number and the second format corresponds to a second floating-point number different then the first.

In one example, generating a converted data signal includes performing both 522 and 524 of the method 500. In such an example, 522 and 524 of the method 500 may be performed in any order. In another example, generating a converted data signal includes performing one of 522 and 524 of the method 500. In such an example, one of 522 and 524 of the method 500 are omitted.

At 530 of the method 500, the converted data signal is processed. For example, the converted data signal 522 is received by the processor 122₁ and is processed according to a function of the application executed by the computing system 100.

In one example, while the method 500 is described above with regard the computing node 120₁, in other examples the method 500 may be performed by the switch circuitry 110 to convert a received data signal to a format supported by the switch circuitry 110. In such an example at 510 of the method 500, the switch circuitry 110 receives the data signal and at 520 of the method 500, the conversion circuitry 116 converts one or more of format and sparse representation of a data signal to that supported by the processor 112 of the switch circuitry 110. In one or more examples, two or more the computing nodes 120 respectively perform the method 500 during an at least partially overlapping period.

While the foregoing is directed to specific examples, other and further examples may be devised without departing from the basic scope thereof, and the scope thereof is determined by the claims that follow.

What is claimed is:

1. A computing node comprising:
 a processor configured to generate a data signal based on a function of an application, wherein the data signal has a first precision format and a first sparse representation;
 conversion circuitry configured to receive the data signal from the processor and generate a converted data signal by at least one of converting the first precision format to a second precision format and converting the first sparse representation to a second sparse representation; and
 routing circuitry configured to transmit the converted data signal to switch circuitry.

2. The computing node of claim 1, wherein the conversion circuitry is configured to convert the first precision format to the second precision format based on at least one selected from the group consisting of a precision format supported by the switch circuitry and statistical information of the application.

3. The computing node of claim 1, wherein the conversion circuitry is configured to convert the first sparse representation to the second sparse representation based on at least one selected from the group consisting of a sparse representation supported by the switch circuitry and statistical information of the application.

4. The computing node of claim 1, wherein the routing circuitry is configured to receive a second data signal from the switch circuitry, and wherein the conversion circuitry is configured to at least one of convert a third precision format of the second data signal to a fourth precision format and convert a third sparse representation of the second data signal to a fourth sparse representation.

5. The computing node of claim 4, wherein the conversion circuitry is configured to convert the third precision format to the fourth precision format based on at least one selected from the group consisting of a precision format supported by the processor and statistical information of the application.

6. The computing node of claim 4, wherein the conversion circuitry is configured to convert the third sparse representation to the fourth sparse representation based on at least one selected from the group consisting of a sparse representation supported by the processor and statistical information of the application.

7. The computing node of claim 1, wherein the first precision format corresponds to one of a higher precision or a lower precision than the second precision format.

8. The computing node of claim 1, wherein the first sparse representation corresponds to at least one of a first number and first location information of one or more of non-zero elements and zero elements, and the second sparse representation corresponds to at least one of a second number and second location information of one or more of non-zero elements and zero elements, wherein the first sparse representation differs from the second sparse representation.

9. A computing system comprising:
 switch circuitry; and
 a first computing node comprising:
  a processor configured to generate a data signal based on a function of an application, wherein the data signal has a first precision format and a first sparse representation;
  conversion circuitry configured to receive the data signal from the processor and to generate a converted data signal by at least one of converting the first precision format to a second precision format and converting the first sparse representation to a second sparse representation; and
  routing circuitry configured to transmit the converted data signal to the switch circuitry.

10. The computing system of claim 9, wherein the conversion circuitry is configured to convert the first precision format to the second precision format based on at least one selected from the group consisting of a precision format supported by the switch circuitry and statistical information of the application.

11. The computing system of claim 9, wherein the conversion circuitry is configured to convert the first sparse representation to the second sparse representation based on at least one selected from the group consisting of a sparse representation supported by the switch circuitry and statistical information of the application.

12. The computing system of claim 9, wherein the routing circuitry is configured to receive a second data signal from the switch circuitry, and wherein the conversion circuitry is configured to at least one of convert a third precision format of the second data signal to a fourth precision format and convert a third sparse representation of the second data signal to a fourth sparse representation.

13. The computing system of claim 12, wherein the conversion circuitry is configured to convert the third precision format to the fourth precision format based on at least one selected from the group consisting of a precision format supported by the processor and statistical information of the application.

14. The computing system of claim 12, wherein the conversion circuitry is configured to convert the third sparse representation to the fourth sparse representation based on at least one selected from the group consisting of a sparse representation supported by the processor and statistical information of the application.

15. The computing system of claim 9, wherein the first precision format corresponds to one of a higher precision or a lower precision than the second precision format.

16. The computing system of claim 9, wherein the first sparse representation corresponds to at least one of a first number and first location information of one or more of non-zero elements and zero elements and the second sparse representation corresponds to at least one of a second number and first location information of non-zero elements and zero elements, wherein the first sparse representation differs from the second sparse representation.

17. A method comprising:
generating, by a processor of a computing node, a data signal based on a function of an application, wherein the data signal has a first precision format and a first sparse representation;
converting, by conversion circuitry of the computing node, the data signal to at least one of a second precision format from the first precision format and a second sparse representation from the first sparse representation to generate a converted data signal; and
transmitting the converted data signal to switch circuitry.

18. The method of claim 17, wherein converting the data signal to the second precision format is based on at least one selected from the group consisting of a precision format supported by the switch circuitry and statistical information of the application, and wherein converting the data signal to the second sparse representation is based on at least one selected from the group consisting of a sparse representation supported by the switch circuitry and the statistical information of the application.

19. The method of claim 17 further comprising:
receiving a second data signal from the switch circuitry, the second data signal comprising a third precision format and a third sparse representation; and
converting, by the conversion circuitry, the second data signal to at least one of a fourth precision format from the third precision format and a fourth sparse representation from the third sparse representation.

20. The method of claim 19, wherein the second data signal is converted to the fourth precision format based on at least one selected from the group consisting of a precision format supported by the processor and statistical information of the application, and wherein the second data signal is converted to fourth sparse representation based on at least one selected from the group consisting of a sparse representation supported by the processor and statistical information of the application.

* * * * *